US009478699B2

(12) United States Patent
Myers et al.

(10) Patent No.: US 9,478,699 B2
(45) Date of Patent: Oct. 25, 2016

(54) NANOSCALE EMITTERS WITH POLARIZATION GRADING

(75) Inventors: Roberto C. Myers, Columbus, OH (US); Siddharth Rajan, Columbus, OH (US)

(73) Assignee: THE OHIO STATE UNIVERSITY, Columbus, OH (US)

( * ) Notice: Subject to any disclaimer, the term of this patent is extended or adjusted under 35 U.S.C. 154(b) by 329 days.

(21) Appl. No.: 13/819,006

(22) PCT Filed: Aug. 25, 2011

(86) PCT No.: PCT/US2011/049084
§ 371 (c)(1),
(2), (4) Date: Apr. 24, 2013

(87) PCT Pub. No.: WO2012/067687
PCT Pub. Date: May 24, 2012

(65) Prior Publication Data
US 2013/0207075 A1 Aug. 15, 2013

Related U.S. Application Data

(60) Provisional application No. 61/377,263, filed on Aug. 26, 2010.

(51) Int. Cl.
*H01L 33/04* (2010.01)
*B82Y 10/00* (2011.01)
(Continued)

(52) U.S. Cl.
CPC .............. *H01L 33/04* (2013.01); *B82Y 10/00* (2013.01); *B82Y 30/00* (2013.01); *H01L 21/0251* (2013.01); *H01L 21/0254* (2013.01); *H01L 21/02458* (2013.01); *H01L 21/02573* (2013.01); *H01L 21/02603* (2013.01);
(Continued)

(58) Field of Classification Search
CPC ............................ B82Y 10/00; Y02E 10/544
See application file for complete search history.

(56) References Cited

U.S. PATENT DOCUMENTS

| 2008/0135089 A1* | 6/2008 | Tsakalakos et al. | 136/248 |
| 2010/0180950 A1* | 7/2010 | Gao et al. | 136/265 |
| 2013/0240348 A1* | 9/2013 | Mi et al. | 204/157.5 |

OTHER PUBLICATIONS

Jena, et al., "Realization of wide electron slabs by polarization bulk doping in graded III-V nitride semiconductor alloys," Applied Physics Letters, vol. 81, No. 23, pp. 4395-4397 (2002).
Koblmüller, et al., "In situ investigation of growth modes during plasma-assisted molecular bean epitaxy of (0001) GaN," Applied Physics Letters, vol. 91, pp. 161904-1-161904-3 (2007).
Chevtchenko, et al., "Surface band bending of a—plane GaN studied by scanning Kelvin probe microscopy," Applied Physics Letters, vol. 88, pp. 122104-1-122104-3 (2006).
(Continued)

Primary Examiner — Fernando L Toledo
Assistant Examiner — Valerie N Newton
(74) Attorney, Agent, or Firm — Fay Sharpe LLP

(57) ABSTRACT

A nanowire comprises a polar semiconductor material that is compositionally graded along the nanowire from a first end to a second end to define a polarization doping profile along the nanowire from the first end to the second end. The polar semiconductor material may comprise a group III-nitride semiconductor, such as an alloy of GaN and AlN, or an alloy of GaN and InN. Such nanowires may be formed by nucleating the first ends on a substrate, growing the nanowires by depositing polar semiconductor material on the nucleated first ends on a selected growth face, and compositionally grading the nanowires during growth to impart the polarization doping. The direction of the compositional grading may be reversed during the growing of the nanowires to reverse the type of the imparted polarization doping. In some embodiments, the reversing forms n/p or p/n junctions in the nanowires.

21 Claims, 13 Drawing Sheets

(51) Int. Cl.
| | |
|---|---|
| B82Y 30/00 | (2011.01) |
| H01L 21/02 | (2006.01) |
| H01L 29/06 | (2006.01) |
| H01L 29/12 | (2006.01) |
| H01L 29/15 | (2006.01) |
| H01L 29/205 | (2006.01) |
| H01L 29/66 | (2006.01) |
| H01L 29/775 | (2006.01) |
| H01L 29/861 | (2006.01) |
| H01L 31/0352 | (2006.01) |
| H01L 31/065 | (2012.01) |
| H01L 31/109 | (2006.01) |
| H01L 31/18 | (2006.01) |
| H01L 33/18 | (2010.01) |
| H01L 29/20 | (2006.01) |
| H01L 33/08 | (2010.01) |
| H01L 33/32 | (2010.01) |
| B82Y 20/00 | (2011.01) |

(52) U.S. Cl.
CPC ...... *H01L 21/02636* (2013.01); *H01L 29/068* (2013.01); *H01L 29/0673* (2013.01); *H01L 29/0676* (2013.01); *H01L 29/122* (2013.01); *H01L 29/15* (2013.01); *H01L 29/205* (2013.01); *H01L 29/66469* (2013.01); *H01L 29/775* (2013.01); *H01L 29/861* (2013.01); *H01L 31/03529* (2013.01); *H01L 31/035227* (2013.01); *H01L 31/065* (2013.01); *H01L 31/109* (2013.01); *H01L 31/1848* (2013.01); *H01L 31/1852* (2013.01); *H01L 33/18* (2013.01); *B82Y 20/00* (2013.01); *H01L 29/2003* (2013.01); *H01L 33/08* (2013.01); *H01L 33/32* (2013.01); *H01L 2924/0002* (2013.01); *Y02E 10/544* (2013.01)

(56) References Cited

OTHER PUBLICATIONS

Kuykendall, et al., "Complete composition tenability of InGaN nanowires using a combinatorial approach," Nature Materials, vol. 6, pp. 951-956 (2007).

Ristić, et al., "On the mechanisms of spontaneous growth of III-nitride nanocolumns by plasma-assisted molecular beam epitaxy," Journal of Crystal Growth, vol. 310, pp. 4035-4045 (2008).

Ambacher, et al., "Two-dimensional electron gases induced by spontaneous and piezoelectric polarization charges in N- and Ga-face AlGaN/GaN heterostructures," Journal of Applied Physics, vol. 85, pp. 3222-3233 (1999).

Kusakabe, et al., "Characterization of Overgrown GaN Layers on Nano-Columns Grown by RF-Molecular Beam Epitaxy," Japan Journal of Applied Physics, vol. 40, pp. L192-L194 (2001).

Simon, et al., "Polarization-Induced Hole Doping in Wide-Band-Gap Uniaxial Semiconductor Heterostructures," Science magazine, vol. 327, pp. 60-64 (2010).

Calleja, et al., "Luminescence properties and defects in GaN nanocolumns grown by molecular beam epitaxy," The American Physical Society, Physical Review B, vol. 62, No. 24, pp. 16826-16834 (2000).

Stoica, et al., Photoluminescence and Intrinsic Properties of MBE-Grown InN Nanowires, Nano Letters, vol. 6, No. 7, pp. 1541-1547 (2006).

Bertness, et al., "Mechanism for Spontaneous Growth of GaN nanowires with molecular beam epitaxy," Journal of Crystal Growth, vol. 310, pp. 3154-3158 (2008).

Yoshizawa, et al., "Growth of Self-Organized GaN Nanostructures on $Al_2O_3$ (0001) by RF Radical Source Molecular Beam Epitaxy," Japan Journal of Applied Physics, vol. 36, pp. L459-L462 (1997).

Heying, et al., "Control of GaN surface morphologies using plasma-assisted molecular beam epitaxy," Journal of Applied Physics, vol. 88, No. 4, pp. 1855-1860 (2000).

Bertness, et al., Spontaneously grown GaN and AlGaN nanowires, Journal of Crystal Growth, vol. 287, pp. 522-527 (2006).

* cited by examiner

NANOSCALE EMITTERS WITH POLARIZATION GRADING

This application claims the benefit of U.S. Provisional Application No. 61/377,263 filed Aug. 26, 2010. U.S. Provisional Application No. 61/377,263 filed Aug. 26, 2010 is incorporated by reference herein in its entirety.

This invention was made with Government support under grant no. N00014-09-1-1153 awarded by the Office of Naval Research. The Government has certain rights in this invention.

BACKGROUND

The following relates to the semiconductor device arts, light emission arts, light detection arts, and related arts.

Material systems such as the group III-nitride and ZnMgO systems show promise for optical emitters and detectors. Epitaxial growth of such materials provides, in principle, the possibility of constructing complex multilayer structures that optimally position material of an optimal composition (i.e., bandgap) for emitting or absorbing light of a desired wavelength or wavelength range. For example, alloys of GaN and AlN have bandgaps suitable for ultraviolet emission.

In practice, however, such devices are hindered by defects (e.g., dislocations and possibly vacancies or other point defects) introduced during lattice-mismatched heteroepitaxial growth, and by low electrical conductivity due to low impurity doping efficiency. This latter issue is heightened in the case of devices operating in the ultraviolet, since suitably wide bandgap materials for operating in the ultraviolet tend to have low intrinsic electrical conductivity.

One way to counter strain-induced defect formation is through the use of quantum wells, nanowires, or other nanostructures. Quantum wells are sometimes convenient to construct as they fit well into the conventional planar epitaxy paradigm. However, the total thickness of the quantum well and any lattice-mismatched cladding layers must be kept close to or below the critical thickness for nucleation of strain-induced dislocations.

Quantization in two- or three-dimensions is also achievable. For example, epitaxial growth conditions can be identified that promote the spontaneous formation (i.e., self-assembly) of nanostructures such as nanowires (localization in two dimensions) or "quantum dots" (localization in all three dimensions). Instead of relying on self-assembly, a patterned substrate (e.g., a substrate coated with a dielectric layer having drilled holes) can serve as a template for the epitaxial growth.

However, nanostructures raise a further impurity doping efficiency issue, in that the small size of the nanostructure can lead to large statistical variations in doping level, especially at lower doping concentrations. This variation can introduce local variations in bandgap that can trap charge carriers or otherwise impede electrical transport. Such dopant variation may also be driven by systematic factors, such as preferential surface segregation of the dopant atoms leading to a higher density of dopant atoms at the outer perimeter of the nanostructure. Another issue with nanostructures is that the high surface area-to-volume ratio leads to a high effective density of surface states, which are believed to act as material defects that can adversely affect electrical transport and can serve as recombination centers.

These issues can be partially addressed by using nanostructures of larger size, which reduces both statistical variation and the surface area-to-volume ratio. However, if the nanostructure is too large then strain-induced defects again arise, as the nanostructure begins to approximate bulk material.

BRIEF DESCRIPTION

In some illustrative embodiments disclosed as illustrative examples herein, a device comprises a nanowire comprising a polar semiconductor material that is compositionally graded along the nanowire. The nanowire includes an n-type region and a p-type region that are joined at a junction or junction region. The compositionally graded polar semiconductor material in the n-type region has a first compositional gradient direction along the nanowire that defines an n-type polarization doping for the n-type region. The compositionally graded polar semiconductor material in the p-type region has a second compositional gradient direction along the nanowire that defines a p-type polarization doping for the p-type region. The second compositional gradient direction along the nanowire is opposite the first compositional gradient direction along the nanowire.

In some embodiments as set forth in the immediately preceding paragraph, the nanowire comprises a group III-nitride semiconductor material whose group III composition is compositionally graded along the nanowire. The n-type region comprises a compositionally graded alloy of gallium nitride and aluminum nitride having an Al/Ga composition that is graded in the first compositional gradient direction, and the p-type region comprises a compositionally graded alloy of gallium nitride and aluminum nitride having an Al/Ga composition that is graded in the second compositional direction opposite the first compositional direction.

In some illustrative embodiments disclosed as illustrative examples herein, a device comprises at least one nanowire having a first end and an opposite second end. The nanowire comprises a polar semiconductor material that is compositionally graded along the nanowire from the first end to the second end to define a polarization doping profile along the nanowire from the first end to the second end. A first electrode is electrically coupled with the first end of the at least one nanowire, and a second electrode is electrically coupled with the opposite second end of the at least one nanowire.

In some illustrative embodiments disclosed as illustrative examples herein, a device comprises at least one nanowire having a first end and an opposite second end. The nanowire comprises a polar semiconductor material that is compositionally graded along the nanowire from the first end to the second end to define a polarization doping profile along the nanowire from the first end to the second end. The polar semiconductor material comprises an alloy of a first polar semiconductor material (X) and second polar semiconductor material (Y). The compositional grading along the nanowire from the first end to the second end defines: a p-type region compositionally graded toward higher Y/X ratio alloy moving away from the first end and toward the second end such that the p type region has p type polarization doping; and an n-type region compositionally graded toward lower Y/X ratio alloy moving away from the first end and toward the second end such that the n type region has n type polarization doping. The p-type region and the n-type region are joined at a junction or junction region to define a diode. In some such embodiments, the first polar semiconductor material (X) is gallium nitride (GaN) and the second polar semiconductor material (Y) is aluminum nitride (AlN).

In some illustrative embodiments disclosed as illustrative examples herein, a device comprises at least one nanowire having a first end and an opposite second end. The nanowire comprises a polar semiconductor material that is compositionally graded along the nanowire from the first end to the second end to define a polarization doping profile along the nanowire from the first end to the second end. The polar semiconductor material comprises an alloy of GaN and InN.

In some illustrative embodiments disclosed as illustrative examples herein, a method comprises: nucleating first ends of nanowires on a substrate; growing nanowires by depositing polar semiconductor material on the nucleated first ends wherein the growing is on a selected growth face; and compositionally grading the nanowires during the growing to impart polarization doping to the growing nanowires. In some such embodiments, the polar semiconductor material comprises a group III-nitride semiconductor material, the nucleating is performed at a first temperature and the growing is performed at a second temperature higher than the first temperature. In some such embodiments, the first temperature is at or below 760° C. and the second temperature is at or above 790° C.

In some illustrative embodiments disclosed as illustrative examples herein, a method comprises: nucleating first ends of nanowires on a substrate; growing nanowires by depositing polar semiconductor material on the nucleated first ends wherein the growing is on a selected growth face; and compositionally grading the nanowires during the growing to impart polarization doping to the growing nanowires. In some such embodiments, the polar semiconductor material comprises a group III-nitride semiconductor material, the nucleating is performed at a first temperature and the growing is performed at a second temperature higher than the first temperature. The second temperature is above the GaN decomposition temperature and the growth rate of the growing is faster than the thermal decomposition rate of GaN at the second temperature In some illustrative embodiments disclosed as illustrative examples herein, a method comprises: nucleating first ends of nanowires on a substrate; growing nanowires by depositing polar semiconductor material on the nucleated first ends wherein the growing is on a selected growth face; compositionally grading the nanowires during the growing to impart polarization doping to the growing nanowires; and reversing the direction of the compositional grading during the growing of the nanowires to reverse the type of the imparted polarization doping. In some embodiments, the reversing forms n/p or p/n junctions in the nanowires.

BRIEF DESCRIPTION OF THE DRAWINGS

Unless otherwise noted, the drawings are not to scale or proportion. The drawings are provided only for purposes of illustrating preferred embodiments and are not to be construed as limiting.

FIG. 9 plots the calculated bandedges CB (conduction hand) and VB (valence band) (scale on left side) and the bandgap (CB-VB) (scale on right side) for the first contemplated design, while FIG. 10 plots calculated carrier drift times for the first design. FIG. 11 shows the device structure for the second contemplated design. FIG. 12 shows the calculated band edges (upper plot) and carrier densities (lower plot) for the second design. FIG. 13 plots calculated electron and hole drift time, and the recombination lifetime, for InGaN as a function of bandgap.

DETAILED DESCRIPTION OF PREFERRED EMBODIMENTS

Figure 1:
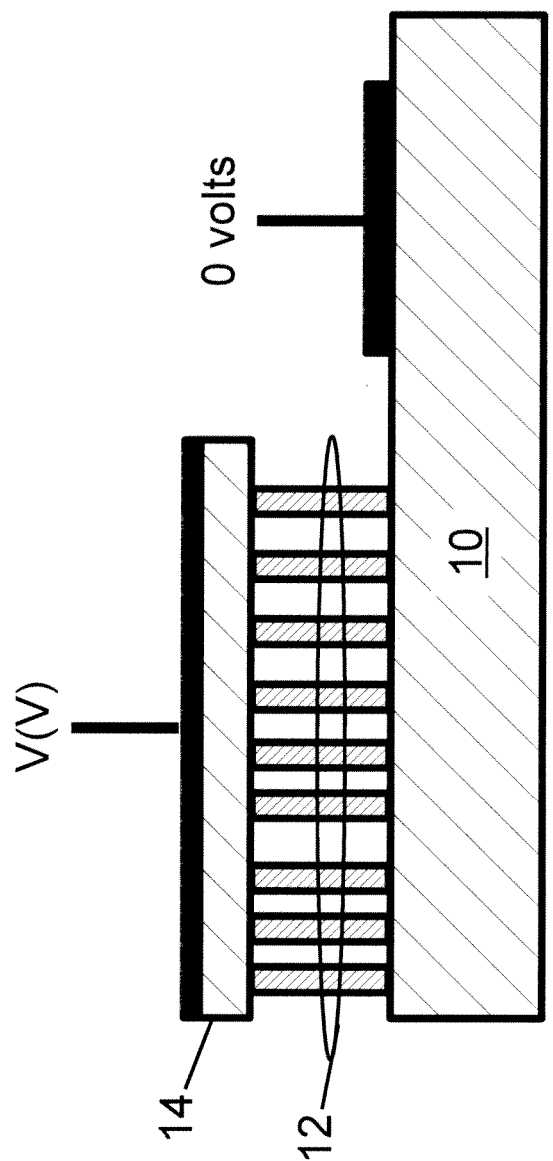
FIG. 1 diagrammatically shows an embodiment of a Schottky structure employing nanowires as disclosed herein.

Disclosed herein are method for synthesis of electronic and photonic devices using lattice-mismatched materials, in which (1) nanoscale epitaxy is used to overcome defect formation during epitaxial growth and (2) compositional grading of the nanoscale epitaxy of polar semiconductors is used to obtain higher charge density that is tailored to produce a desired polarization doping profile (e.g., forming a p/n junction), resulting in lower resistance and better efficiency.

Nanowires sidestep the constraint of epitaxial strain making possible extreme energy landscapes for electrons and holes in graded AlGaN and InGaN heterostructures, while maintaining single crystal defect-free active regions. It is recognized herein that this, in turn, enables large built-in electric fields due to polarization charge that separate electrons and holes with high speed and efficiency, properties that enable high speed photodetectors covering a broad range in energy. Polarization grading is used herein to achieve impurity-free p and n type doping in nanowires, which sidesteps the problem of statistical doping in nanostructures. In this way, a dopant-free pn-junction light emitting diode (LED) can be achieved. Thus, a synergy is recognized herein between the nanowire form and polarization doping of the nanowire.

It is noted that terms such as "impurity-free" doping and similar phraseology are understood in the art to denote a material that does not have intentionally added impurity doping. It is understood that a typical semiconductor material has a background level of impurity dopants, and that the background level of impurity dopants will generally lead to a low impurity doping component whose type (n-type or p-type) depends upon the type and net concentration of background dopants. As used herein, an impurity-free polarization doped semiconductor material is one whose doping level is controlled by its polarization doping (which, in turn, is controlled by its compositional grading and the polarity of the epitaxial growth). The impurity-free polarization doped semiconductor material is expected to have some background level of impurities that contribute to the free electron or hole concentration (i.e., to the doping level); however, this background impurity doping is smaller than the polarization doping for the impurity-free polarization doped semiconductor material.

It is also contemplated for a material to include both intentional impurity doping and polarization doping. In such a case, the relative contributions of free carriers (holes or electrons) from the impurities and the polarization doping effect, respectively, controls the net doping of the material. Note in this regard that it is also possible for the background doping to be sufficiently high that the background doping dominates over the polarization doping.

Nanowires based on the group III-nitride system (e.g., GaN, AlN, InN, various binary, ternary, and/or quaternary alloys thereof, and so forth) are disclosed as illustrative examples. The group III-nitride system exhibits large lattice mismatches between various member materials (e.g., between GaN and AlN), and group III-N materials are also polar materials that exhibit polarization charge and polarization doping effects in suitable compositionally graded structures. However, it is to be understood that the disclosed techniques are applicable generally to polar semiconductors that exhibit polarization charge and polarization doping effects in suitable compositionally graded structures and that can be grown in the form of nanowires by self-assembly and/or by the use of a template such as a dielectric layer with drilled holes defining nanowire growth templates. Some other polar semiconductors that exhibit polarization charge and polarization doping effects include ZnO, MgO, LiNbO$_3$, and so forth. Compositionally graded nanowires of such materials are expected to be obtainable using a template, and in some cases may also be obtainable by self-assembly using suitable growth conditions.

Various self-assembly approaches are known for fabricating gallium nitride (GaN) nanowires. See, e.g. Heying et al. "Control of GaN surface morphologies using plasma-assisted molecular beam epitaxy", *J. Appl. Phys.* 88, 1855 (2000). have reported a growth diagram for plasma-assisted molecular beam epitaxy (MBE) growth of GaN. This diagram was expanded in 2007 by Koblmuller et al. "In situ investigation of growth modes during plasma-assisted molecular beam epitaxy of (0001) GaN", *Appl. Phys. Lett.* 91, 161904 (2007). combining in-situ studies of reflectivity by reflection high energy electron diffraction (RHEED) with quadrapole mass spectroscopy (QMS) to measure Ga-desorption, In the growth diagram, nanowires are observed at N-rich growth conditions Yoshizawa et al., "Growth of Self-Organized GaN Nanostructures on Al$_2$O$_3$(0001) by RF-Radical Source Molecular Beam Epitaxy", *Jpn. J. Appl. Phys.* 36, L459 (1997); see also Calleja et al., "Luminescence properties and defects in GaN nanocolumns grown by molecular beam epitaxy", *Phys. Rev. B* 62, 16826 (2000); Kusakabe et al., "Characterization of Overgrown GaN Layers on Nano-Columns Grown by RF-Molecular Beam Epitaxy", *Jpn. J. Appl. Phys.* 40, L192 (2001); Bertness et al., "Spontaneously grown GaN and AlGaN nanowires", *J. Crys. Gro.* 287, 522 (2006). Nanowires form on Si (111) substrates utilizing the N-rich growth mode and comprise c-plane (0001) oriented hexagonal nanowires. Various 3D type growth modes can occur during MBE due to lattice mismatch between the epitaxial layer and the substrate (or underlying layers lattice-matched with the substrate). Without being limited to any particular theory of the kinetics of GaN nanowire growth, it is noted that Ristic et al, "On the mechanisms of spontaneous growth of III-nitride nanocolumns by plasma-assisted molecular beam epitaxy", *J. Crys. Gro.* 310, 4035 (2008) suggest that GaN nanowire growth occurs in the Volmer-Weber (VW) mode where the critical radius of stable GaN islands is determined by substrate temperature. In the VW growth mode, 3D islands greater than a critical radius ($r_c$) are stable and will grow. Bertness et al. "Mechanism for spontaneous growth of GaN nanowires with molecular beam epitaxy", *J. Crys. Gro.* 310, 3154 (2008) propose a similar kinetic mechanism of GaN nanowire growth where enhanced sticking coefficient between c-plane (nanowire tip) and m-plane (nanowire sidewall) explains the high anisotropy in growth rates leading generally toward fast vertical growth.

MBE grown nanowires exhibit reduced dislocation density as well an increased range of allowable lattice mismatch in heterostructures. Without being limited to any particular theory of strain relief, it is believed that the improved crystal quality obtainable in group III-N nanowires grown on lattice-mismatched substrates such as silicon or sapphire is due to the high surface to volume ratio of the nanowire. MBE grown group III-N nanowires can be grown catalyst-free, and as a result they do not suffer transition metal contamination. On the other hand, group III-N nanowires grown by chemical vapor deposition (CVD) typically employ a catalyst and accordingly may have some transition metal contamination. See Kuykendall et al., "Complete composition tunability of InGaN nanowires using a combinatorial approach", *Nat. Mater,* 6, 951 (2007). Using MBE growth, quantum structures can be grown along the length of the wire with monolayer (ML) precision, forming disks with carriers confined along the length of the wire. Thus, for example, inserting a "quantum well" at some point along the length of the nanowire is readily achievable in MBE growth. Although the illustrative fabrication examples disclosed herein employ MBE to grow the nanowires, it is expected that similar results can be achieved in CVD using a dielectric template with drilled holes, or by performing growth in a 3D region of the CVD growth diagram.

Another useful growth dynamic that has been observed in MBE GaN growth is that by suitable adjustment of the epitaxy conditions the growth mode can be adjusted back from 3D growth to planar 2D growth leading to coalescence at the top of the nanowire arrays. This allows for in situ MBE growth of a planar GaN contact layer on top of the nanowires for use in vertical transport devices such as photovoltaic cells, vertical transport light emitting diode (LED) devices, vertical transport semiconductor laser devices, and so forth. See, e.g. Kikuchi et al., "InGaN/GaN Multiple Quantum Disk Nanocolumn Light-Emitting Diodes Grown on (111) Si Substrate", *Jpn. J. Appl. Phys.* 43, L1524 (2004). If such an in situ 3D→2D transition is not feasible, alternatives include removing the sample from the growth system after formation of the nanowires and performing suitable processing such as dielectric deposition to fill gaps between nanowires, planarization, deposition of a Schottky contact or formation of a crystalline group III-N epitaxial regrowth contact.

The inventors have performed strain distribution modeling that simulated the inhomogeneous strain profile in a graded GaN—AlN—GaN nanowire heterostructure by solving the strain tensor equation. See Ristic et al., "Carrier-confinement effects in nanocolumnar GaN Al$_x$Ga1-x N quantum disks grown by molecular-beam epitaxy", *Phys. Rev. B* 72, 085330 (2005). These simulations indicate that epitaxial strain is substantially relaxed in nanowires as compared with equivalent compositional grading of a layered (2D) structure, thus increasing the critical thickness and preventing defect formation even in InN/GaN and GaN/AlN nanowires of lengths of about 1 micron. The strain model employed also accommodates inclusion of both spontaneous and piezo polarization for improved band diagrams.

Polarization doping methods have been employed in planar (2D) III-Nitrides. See U.S. Pat. No. 7,525,130 issued Apr. 28, 2009; Ambacher et al., "Two-dimensional electron gases induced by spontaneous and piezoelectric polarization charges in N- and Ga-face AlGaN/GaN heterostructures", *J. Appl. Phys.* 85, 3222 (1999).]. In the nanowires disclosed herein, polarization doping is applied to nanowire heterostructures. It is found that there is an advantageous synergy between the nanowire structural configuration and polarization doping. Since nanowires accommodate epitaxial strain better than bulk (2D) layers, nanowires can achieve polarization doping levels that are not achievable in polarization-doped 2D layers, such as GaN→AlN nanowire grading, which along the Ga-face leads to an n-type polarization-doped region. Jena et al., "Realization of wide electron slabs by polarization bulk doping in graded III-V nitride semiconductor alloys", *Appl. Phys. Lett.* 81, 4395 (2002). Additionally, it is disclosed to grade back from AlN to GaN to generate p-type polarization charge and hence an in situ grown n/p GaN/ . . . /AlN/ . . . /GaN nanowire diode structure.

Another synergistic effect of combining the nanowire structure with polarization doping is that it overcomes the problem of statistical doping in nanowires. This problem arises because the statistical averaging implicit in impurity doping can break down as the crystal size approaches the distance between donors and acceptors, as in the case of narrow-diameter nanowire structures. In contrast, polarization doping operates on a "per-unit cell" basis, and can provide a uniform charge distribution in a nanowire. A further synergistic aspect is that the large surface-to-volume ratio of nanowires can provide a high density of surface states, which in turn provide a reservoir of charges for the polarization doping. These surface states can outnumber the bulk trap states in the nanowire. It is recognized herein that, in this case, robust p-type polarization doping can be realized with reduced Mg doping (or other p-type impurity doping), and possibly with no impurity doping at all. For polarization p-type doping, surface acceptors from the exposed m-plane of the nanowires will be ionized. Their density is estimated as $1 \times 10^{12}$ cm$^{-2}$ with an activation energy ($E_A$) of about $E_A=1.2$ eV. See Chevtchenko et al., "Surface band bending of a-plane GaN studied by scanning Kelvin probe microscopy", *Appl. Phys. Lett.* 88, 122104 (2006). By way of quantitative example, a nanowire having a diameter of 20 nm and a length of 200 nm, and a (bulk) background donor density of $3 \times 10^{17}$ cm$^{-3}$, the volume $V=(200 \text{ nm}) \times [\pi(10 \text{ nm})^2]=62,830$ nm$^3$ and the surface area is $S=(200 \text{ nm}) \times [\pi(20 \text{ nm}]=12,566$ nm$^2$. The total number of bulk donors is $N_d=(3 \times 10^{17}$ cm$^{-3}) \times (62,830$ nm$^3) \times (\text{cm}/10^7$ nm$)^3=18.85$. The total number of surface acceptors is $N_a=(1 \times 10^{12}$ cm$^{-2}) \times (12,566$ nm$^2) \times (\text{cm}/10^7$ nm$)^2=125.66$. Thus, there are about 100 more total acceptors than donors, leading to a net positive charge. Normalizing by the total sample volume $V=62,830$ nm$^3$ yields $N_a-N_d=(125.66-18.85)/[62,830 \text{ nm}^3 \times (\text{cm}/10^7 \text{ nm})^3]=1.70 \times 10$ cm$^{-3}$ (which is a p-type or acceptor doping). This should enable p-type doping that is impurity-free, or which in some embodiments requires only a low level of p-type impurity doping to offset the (bulk) background n-type doping.

To demonstrate the disclosed approaches, MBE growth of compositionally graded group III-N nanowires were grown by a two-step approach employing a lower temperature nanowire nucleation step followed by a higher temperature nanowire growth step. The two-step growth approach is described in Carnevale et al., "Three-Dimensional GaN/AlN Nanowire Heterostructures by Separating Nucleation and Growth Processes", *Nano Lett.* vol. 11 pages 866-71 (2011), and is summarized in the following. Samples were grown in the N-rich regime at temperatures ranging from 700° C. to 800° C. at various combinations of III/V ratio and substrate temperatures to map out the growth phase diagram. III/V ratio was calibrated using a beam flux monitor, which is proportional to the active Ga flux. The active nitrogen flux is measured by growing a series of GaN samples at various Ga fluxes and measuring the growth rate. This enables direct measurement of the cross over from Ga-limited to N-limited growth and provides a specific Ga-flux at which the active nitrogen flux is equal to the active Ga flux (that is, the stoichiometric point at which the III/V ratio equals unity). The pyrometer temperature value was calibrated by observing the 7×7 to 1×1 RHEED transition that occurs on Si (111) at 830° C. This was cross-correlated with the aluminum melting point (660° C.) which was observed by heating a silicon wafer with an Al thin film deposited and observing the Al melting. These studies identified MBE growth regions over which nanowire density is controllable over two orders of magnitude. Nanowire diameter (or radius) information were extracted from plan-view and cross-sectional scanning electron microscopy (SEM). Using the developed growth maps, specific nanowire densities and radii were selected for the fabrication of nanowire heterostructures described herein. The MBE growth studies support the model of an island growth mode mechanism in which nucleation of GaN islands on Si is followed by growth. In this model, nanowires form because of preferential growth along the c-plane of GaN versus the m-plane sidewalls. In this growth model, nanowire nucleation will continue throughout the growth process, which would prohibit the generation of uniform nanowire heterostructures since a distribution of different nanowire sizes would result. To overcome this nucleation and growth issue, a two-step growth method was employed, which involves (1) nucleation of nanowires at low temperatures (720° C. to 760° C.) at which a target nanowire density is selected, and (2) growth of the nanowires at higher temperature (790° C. to 830° C., which is above the GaN decomposition temperature of 750° C.). Under these higher temperature conditions new nanowires will not nucleate. As long as growth rate of GaN on the pre-existing GaN nanowires is faster than the thermal decomposition rate, nanowires can be grown while preventing the nucleation of newer nanowires.

To test this method, a series of three samples were grown. The first sample served as a reference sample for assessing the starting density of nanowires. The reference sample was a low density GaN reference nanowire sample that was grown at 765° C. and III/N ratio 0.25 for 30 minutes. The second sample was grown for 90 minutes at the same conditions as the reference sample. Note that both the first, i.e. reference, sample and the second sample were grown using only the first, lower temperature nucleation step. Comparison of these first two samples verified that nanowires continue to be nucleated throughout the deposition, resulting in a high density nanowire sample with relatively fast vertical growth rates. Finally, the third sample was grown using the two-step process by first depositing GaN for 30 minutes at 765° C. and then increasing the substrate temperature to 815° C. followed by 60 minutes of GaN deposition. The two-step sample exhibited almost the same nanowire density as the reference sample, demonstrating that additional nanowire nucleation is suppressed in the second, higher temperature growth step of the two-step growth method. Additionally, the growth kinetics are strongly modified by the higher temperature of the second step. The two-step grown sample exhibited a relatively slow vertical growth rate and enhanced coaxial growth rate. This demonstrates a method to engineer the relative coaxial versus vertical growth rates.

Compositionally graded GaN—AlN nanowires were grown in the following way. To achieve linearly graded GaN—AlN nanowires both the Ga and Al beam fluxes are linearly changed during nanowire growth. Since the flux changes exponentially with effusion cell temperature, a logarithmic ramping of the effusion cell temperature was performed under computer control, and the measured fluxes were verified to ramp linearly. Scanning electron microscopy (SEM) and x-ray diffraction (XRD) indicated good nanowire growth evidencing graded AlGaN lattice constants.

For photonic applications it is advantageous to produce a large cross-sectional active area, which calls for a high density of nanowires. At these high densities it is feasible to form a common p–GaN top contact (that is, a continuous p–GaN layer) to allow for vertical transport through the array of nanowires. Coalesced p–GaN can be formed by transitioning from N-rich conditions during the nanowire growth, to Ga-rich conditions. See, e.g. Kikuchi et al., "InGaN/GaN Multiple Quantum Disk Nanocolumn Light-Emitting Diodes Grown on (111) Si Substrate", *Jpn. J. Appl. Phys.* 43, L1524 (2004). SEM of a coalesced Mg-doped GaN top layer grown by this approach showed a Mg-doped p–GaN layer was grown at Ga-rich (III/N=2) conditions. This top layer was about 70 nm tall and was a rough, partially coalesced top film.

The disclosed devices utilize compositionally graded nanowires configured to define desired polarization-doped structures. Unlike in bulk epitaxial heterostructures, nanowires can accommodate epitaxial strain without necessarily nucleating misfit dislocations (that lead to charged threading dislocations) at the heterointerface. Thus, it is possible to grade from GaN to AlN and back to GaN in a single crystal without dislocations. Similarly InN—GaN—AlN is possible. This enables not only a tunable bandgap, but full access to the massive polarization charge. It is recognized herein that large polarization doping can occur in compositionally graded nanowires because the large surface to volume ratio in nanowires translates into an enhanced robustness of the polarization doping as compared with polarization-doped 2D layers. This occurs because the surface states, which are responsible for the charges associated with polarization doping, can outnumber the bulk trap states inherent to III-Nitrides.

Figure 2:
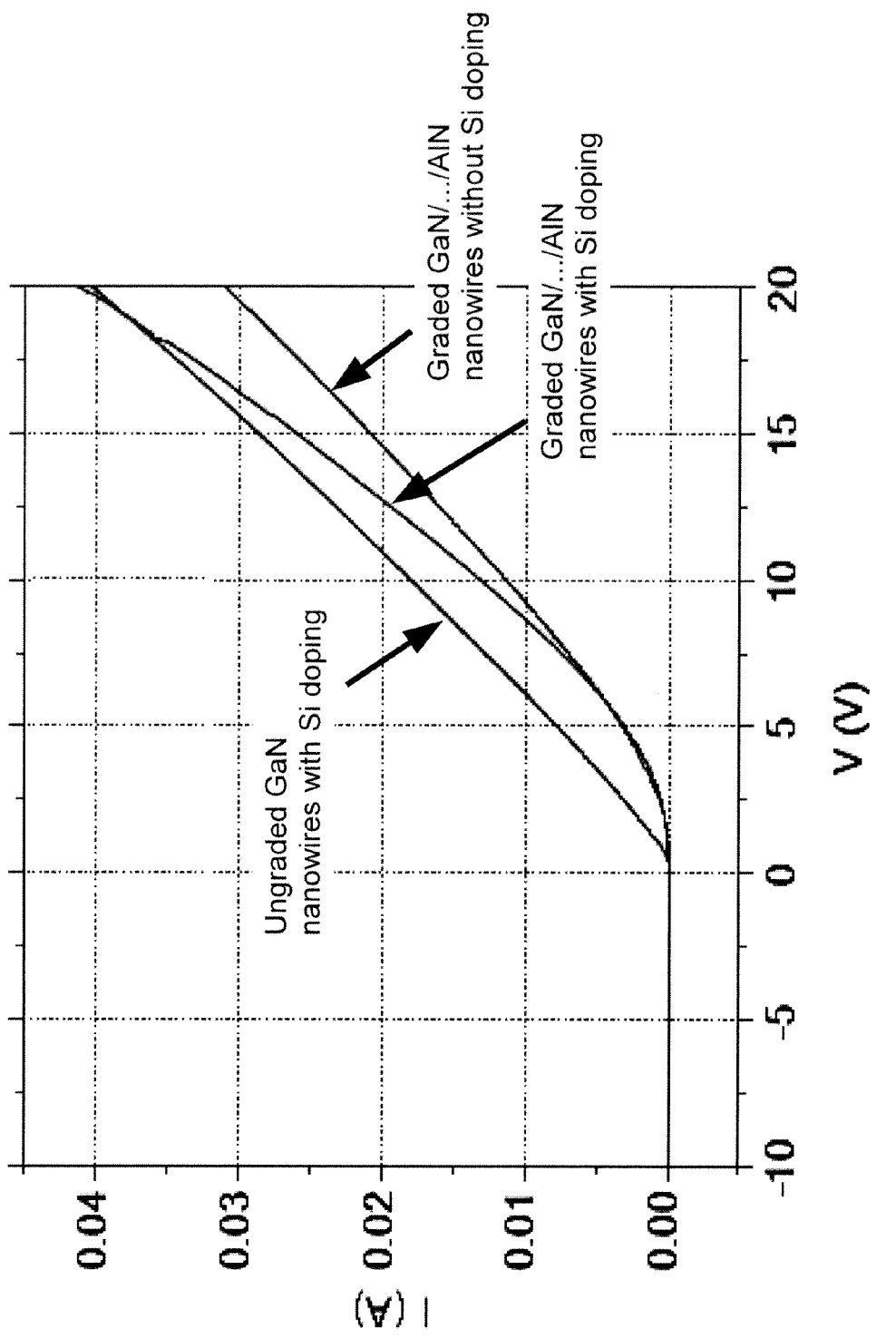
FIGS. 2 and 3 plot measured results for group III-N devices fabricated in accordance with FIG. 1.
Figure 3:
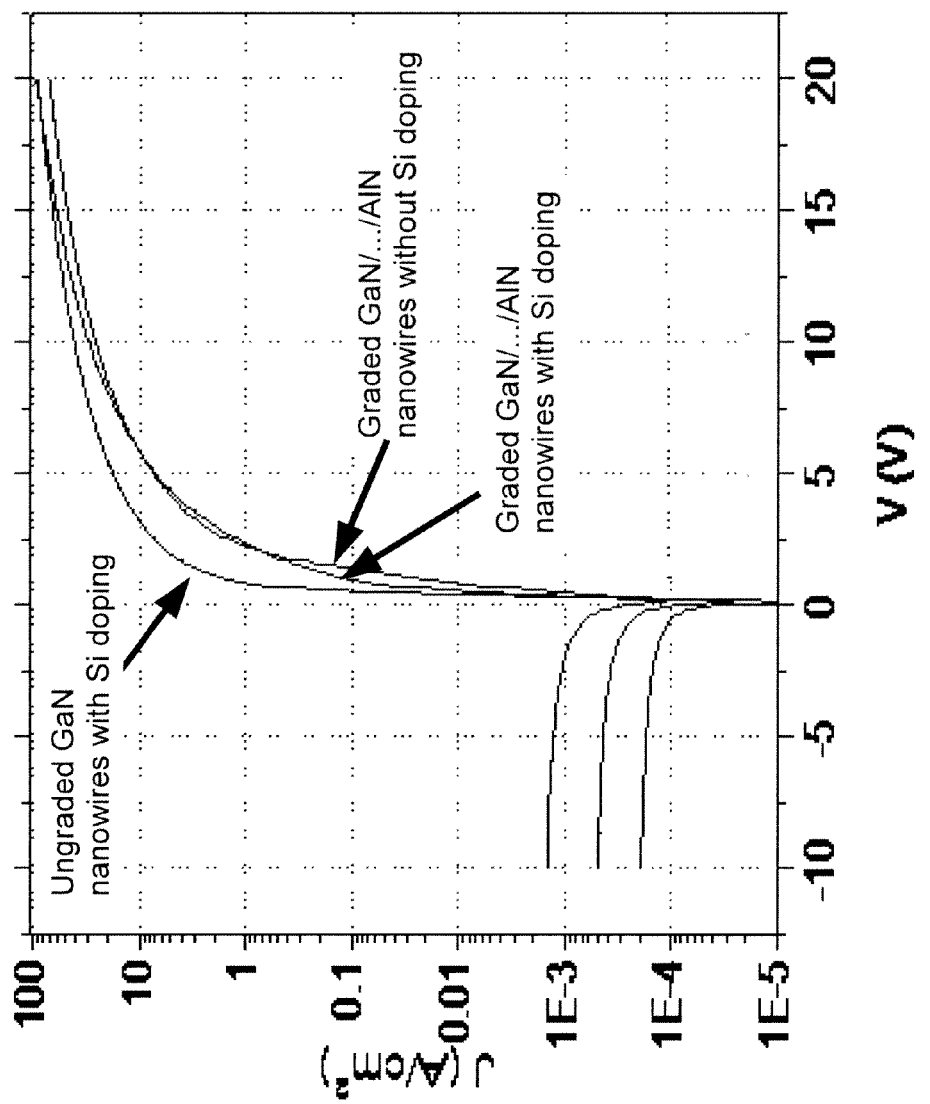

With reference to FIGS. 1-3, results for polarization doped compositionally graded GaN/ . . . /AlN nanowires is shown. FIG. 1 shows the device structure that was grown. A substrate 10 comprises n–Si (111). Nanowires 12 were grown in the (111) n–Si substrate 10 using the two-step approach disclosed herein. Three different samples were grown. First, as reference, a sample comprising ungraded silicon-doped GaN nanowires was grown. Second, a sample comprising graded silicon-doped GaN/ . . . /AlN nanowires was grown. Third, a sample comprising graded undoped GaN/ . . . /AlN nanowires was grown. To enable electrical measurements, a Schottky contact 14 was formed on the upper ends of the nanowires 12. The Schottky contact 14 comprised 20 nm Ti and 50 nm Au. The substrate 10 was held at 0 volts while a bias V was applied to the Schottky contact 14. FIGS. 2 and 3 show the measured current-voltage (I-V) curves plotted on linear and logarithmic scales, respectively. The largest dI/dV ratio was observed for the sample with both silicon doping and polarization doping, while the ungraded doped GaN nanowires and the graded (but undoped) GaN/ . . . /AlN nanowires show comparable dI/dV ratios. This demonstrates effective n-type polarization doping of the nanowires.

In the embodiment of FIGS. 1-3, the compositional grading is from lower (or zero) aluminum composition toward higher aluminum compositions, i.e. away from GaN and toward AlN, or said yet another way the nanowire is graded $Al_xGa_{1-x}N$ in which the compositional fraction x is graded toward larger values. This polarity of compositional grading when grown on a Ga-face leads to n-type polarization doping.

On the other hand, compositional grading may be from higher aluminum composition toward lower (or zero) aluminum composition, i.e. away from AlN and toward GaN, or said yet another way the nanowire is graded $Al_xGa_{1-x}N$ in which the compositional fraction x is graded toward lower values. In this case, when growing on a Ga face the compositional grading leads to p-type polarization doping.

Figure 4:
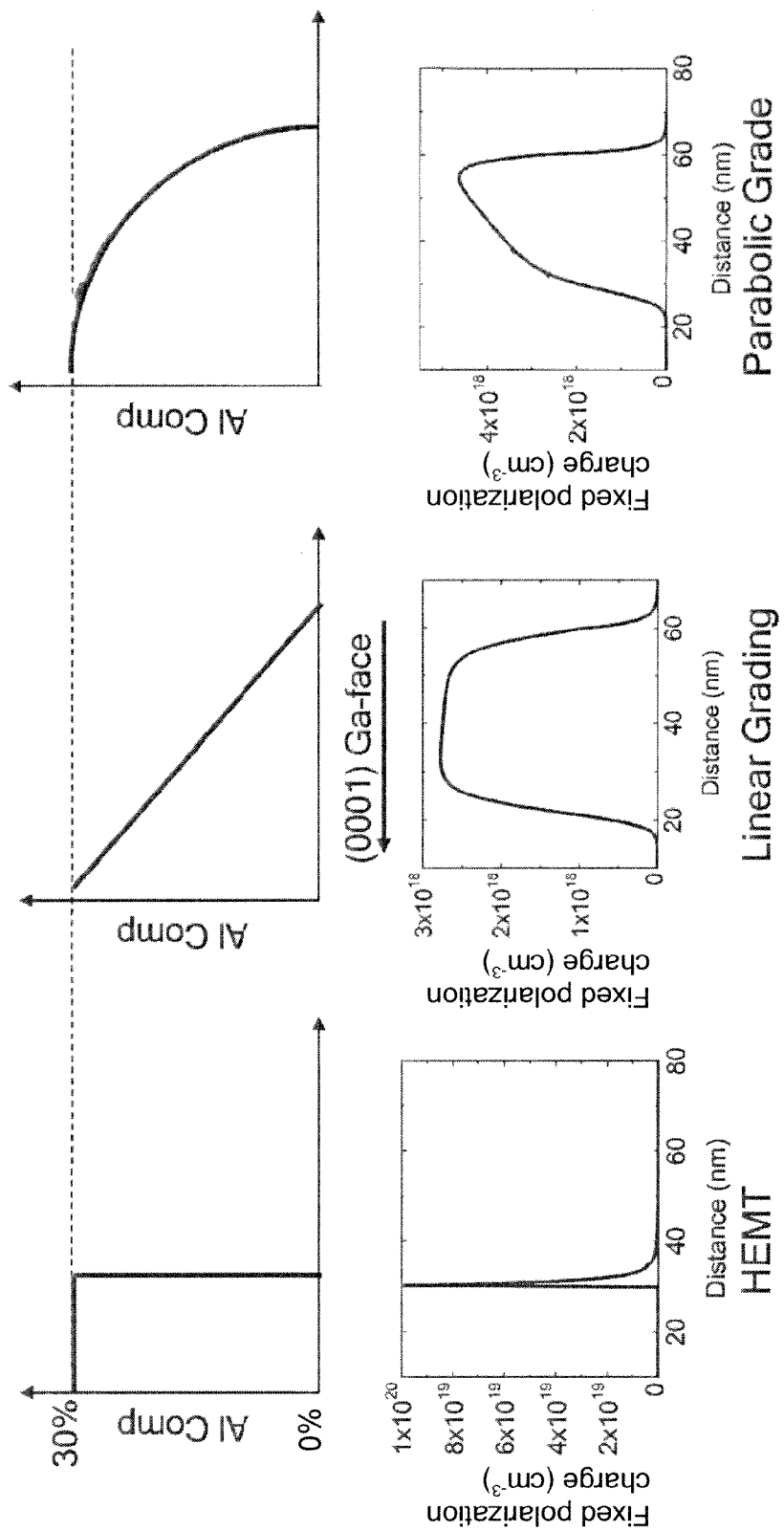
FIG. 4 plots various calculated polarization doping profiles for group III-N nanowires.

With reference to FIG. 4, these results can be generalized. The fixed polarization charge=$\nabla_z \cdot P(z)=dP/z$. The polarization is an almost linear function of the aluminum composition, so for $Al_xGa_{1-x}N$ the fixed polarization charge can be written as polarization charge $dx(z)/dz$ where $x(z)$ denotes the aluminum fraction at z. The polarity of the polarization depends upon the crystal orientation, which from an epitaxy viewpoint corresponds to the growth face, e.g. growth on a Ga-face or growth on a N-face. The top row of FIG. 4 shows three illustrative compositional profiles: a step $Al_{0.30}Ga_{0.70}N/GaN$ step at left, a linearly graded $Al_{0.30}Ga_{0.70}N/\ldots/GaN$ structure in the middle, and a parabolic graded $Al_{0.30}Ga_{0.70}N/\ldots/GaN$ structure at right. In these examples the Ga face is toward the left as indicated in FIG. 4. Thus, for example, the middle linear grade shows grading from 0-30% Al (i.e., growth direction toward the left) in the case of growth on the Ga face, or alternatively shows grading from 30-0% Al (i.e., growth direction toward the right) in the case of growth on the N face. The bottom row of FIG. 4 shows the corresponding fixed polarization charge profile. The polarization doping corresponds to the free charge which is equal in magnitude to the fixed polarization charge but opposite in sign. The results of FIG. 4 are briefly summarized in Table 1.

TABLE 1

| Growth face | Grading direction | Fixed polarization charge | Polarization doping |
| --- | --- | --- | --- |
| Ga face | GaN → AlN | Positive | n-type |
| Ga face | AlN → GaN | Negative | p-type |
| N face | GaN → AlN | Negative | p-type |
| N face | AlN → GaN | Positive | n-type |

Row three of Table 1, i.e. p-type polarization doping by grading toward higher Al composition in N-face epitaxy, has been observed in bulk (2D) p-$Al_xGa_{1-x}N$ layers grown in the N-face epitaxial orientation, although net p-type layers were only obtained by combining the polarization doping with Mg co-doping. Simon et al., Science vol. 327 pp. 60-64 (January 2010). Because AlGaN contains a background of donors, these donors must first be compensated to allow the polarization doping to work. Table 1 suggests that complex doping structures and perhaps even p/n junctions could, in principle, be fabricated solely using polarization doping without recourse to impurity doping. However, in practice the large compositional variation entailed in such structures is unlikely to be achievable in a bulk (2D) group III-N structure since the lattice mismatch would lead to defect formation and consequent production of high concentrations of point defects and line defects (i.e., dislocations) that would overwhelm the polarization doping effect.

It is recognized herein, however, that nanowires which are compositionally graded in continuous and/or stepwise fashion can achieve complex doping structures, because (1) the 3D structure is less susceptible to nucleate point or line defects due to the large lattice mismatch and (2) the 3D structure provides a higher density of surface states as compared with bulk defect states, and the surface states promote the polarization doping and prevent it from being overwhelmed by point or line defects.

Figure 5:
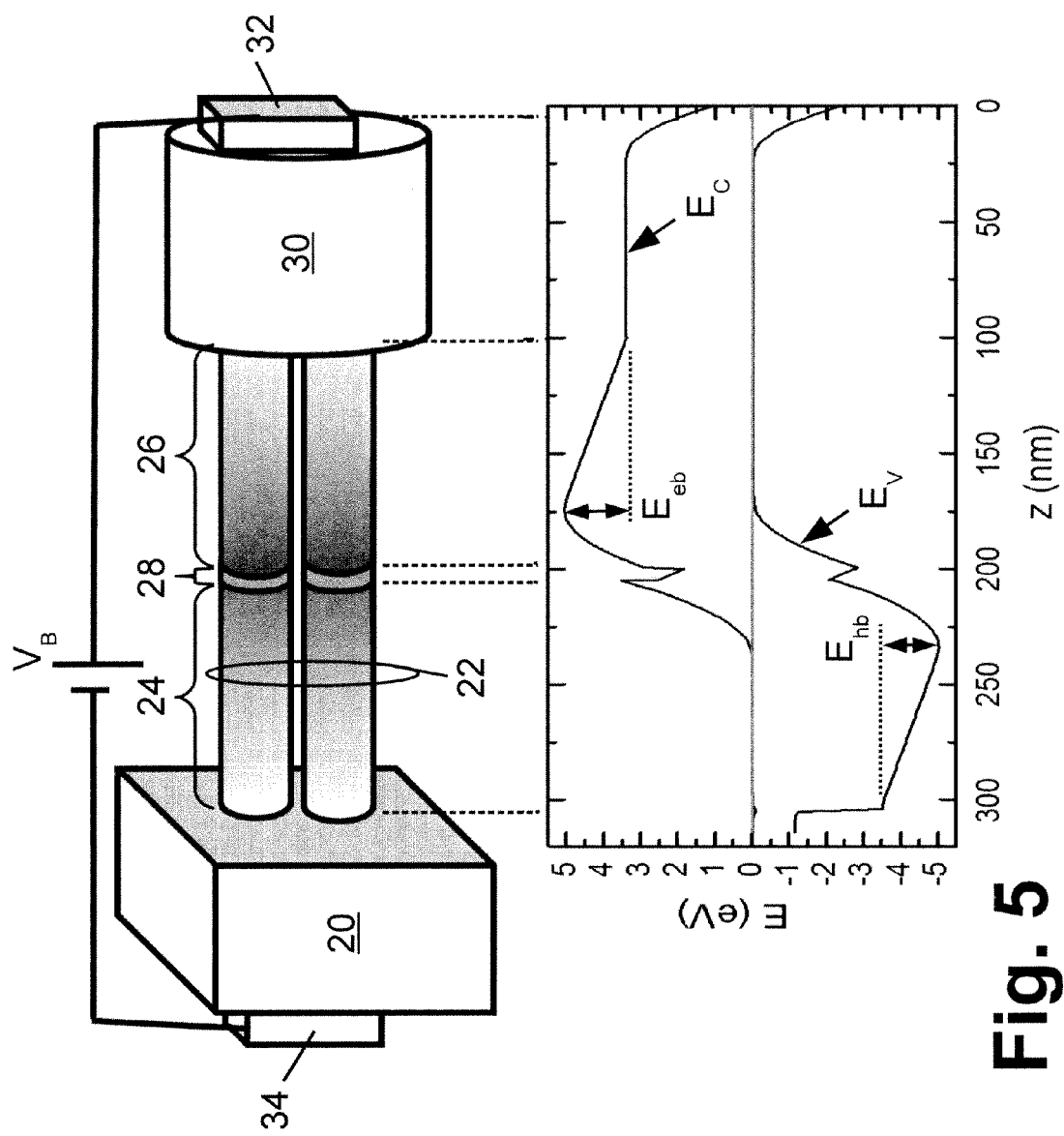
FIG. 5 diagrammatically shows an embodiment of an n/p nanowire diode structure including a quantum well active region. A calculated band diagram for the device is shown in the lower portion of FIG. 5.

With reference to FIG. 5, to demonstrate this effect n/p nanowire diodes employing polarization doping were grown and characterized. The upper portion of FIG. 5 diagrammatically shows the structure, while the lower portion of FIG. 5 shows a calculated band diagram including the conduction band ($E_c$) and valence band ($E_v$) for the structure. Beginning from an n+Si wafer 20, Ga-face GaN nanowires 22 were graded from GaN to AlN over an n-type region 24 that is n-type due to the polarization doping (corresponding to row 1 of Table 1, i.e. Ga-face growth with grading toward higher Al composition). The n-type polarization doping leads to a flat conduction band over the n-type region 24. Consequently, the increase in bandgap over the n-type region 24 due to the increasing Al content shows up principally in the valence band, as seen in the band diagram. This leads to a hole barrier $E_{hb}$ in the valence band. The Anderson approximation predicts a minimal conduction band barrier to electron transport across the n+Si/n–GaN heterointerface, which should provide a good Ohmic interface to the Si wafer 20. In a subsequent p-type region 26, the composition is graded back from AlN to GaN, resulting in a polarization p-doped layer (corresponding to row 2 of Table 1, i.e. Ga-face growth with grading toward lower Al composition). In this case, the Fermi level lies in the valence band (i.e., the valence band is substantially flat in the p-type region 26) leading to large band bending in the conduction band which acts to form an electron barrier $E_{cb}$ in the conduction band that efficiently blocks electrons. Mg co-doping was employed in the p-type region 26, as this was found to improve the p-type conductivity provided by the p-type polarization doping.

The nanowires 22 also include a quantum well active region 28 disposed between the n-type region 24 and the p-type region 26. The illustrative quantum well comprises a thin 5 nanometer layer of $Al_{0.50}Ga_{0.50}N$ to achieve 4 eV (310 nm) ultraviolet emission as simulated using the quantum-corrected Schroedinger solution to the quantum well. More generally, the active region can contain substantially any group III-N semiconductor material, including InGaN, and thus such a light emitting diode (LED) design could achieve any color from 0.7 to 6 eV, in principle. Moreover, the quantum well 28 is optionally omitted entirely, or alternatively may be replaced by a multi-quantum well structure, a superlattice structure, or so forth.

As noted, the Anderson model predicts good electron transport across the n–Si/n–GaN heterointerface. To prepare this interface, the Si substrates were heated to greater than 1100° C. to desorb the oxide and cooled to growth temperature. The wafer was rotated away from the sources and the N plasma was ignited while blocking it with a shutter to minimize nitridation of the Si surface. The Si wafer was then rotated toward the effusion cells and both Ga and N plasma shutters were opened simultaneously. Reflection high energy electron diffraction (RHEED) taken immediately before opening the shutters showed a bright streaky 7×7 pattern. No buffer layers such as AlN or nitridation layers were used.

To enable electrical contact to the nanowires 22, a coalesced p–GaN layer 30 was formed by shifting the 3D growth back to 2D GaN growth after growing the nanowires 22. Additionally, electrical contacts 32, 34 were made to the p–GaN layer 30 and the substrate 20, respectively, so that an electrical bias $V_B$ (for example, a battery, storage capacitor or other d.c. voltage source, or an a.c. voltage source, or a d.c. or a.c. current source) can be applied.

The top p–GaN layer 30 and the bottom n+Si substrate 20 are highly absorbing for ultraviolet radiation, and so the illustrative design of FIG. 5 is not as efficient as a UV-LED as it could be. One option for improving optical extraction efficiency is to incorporate some aluminum into the top contact layer, e.g. replacing the p–GaN layer 30 with 50% AlGaN. Another option is to replace the Si substrate 20 with a sapphire substrate. Another option is to reduce the active region bandgap by incorporating additional gallium (e.g., pure GaN) or indium (e.g. InGaN).

Figure 6:
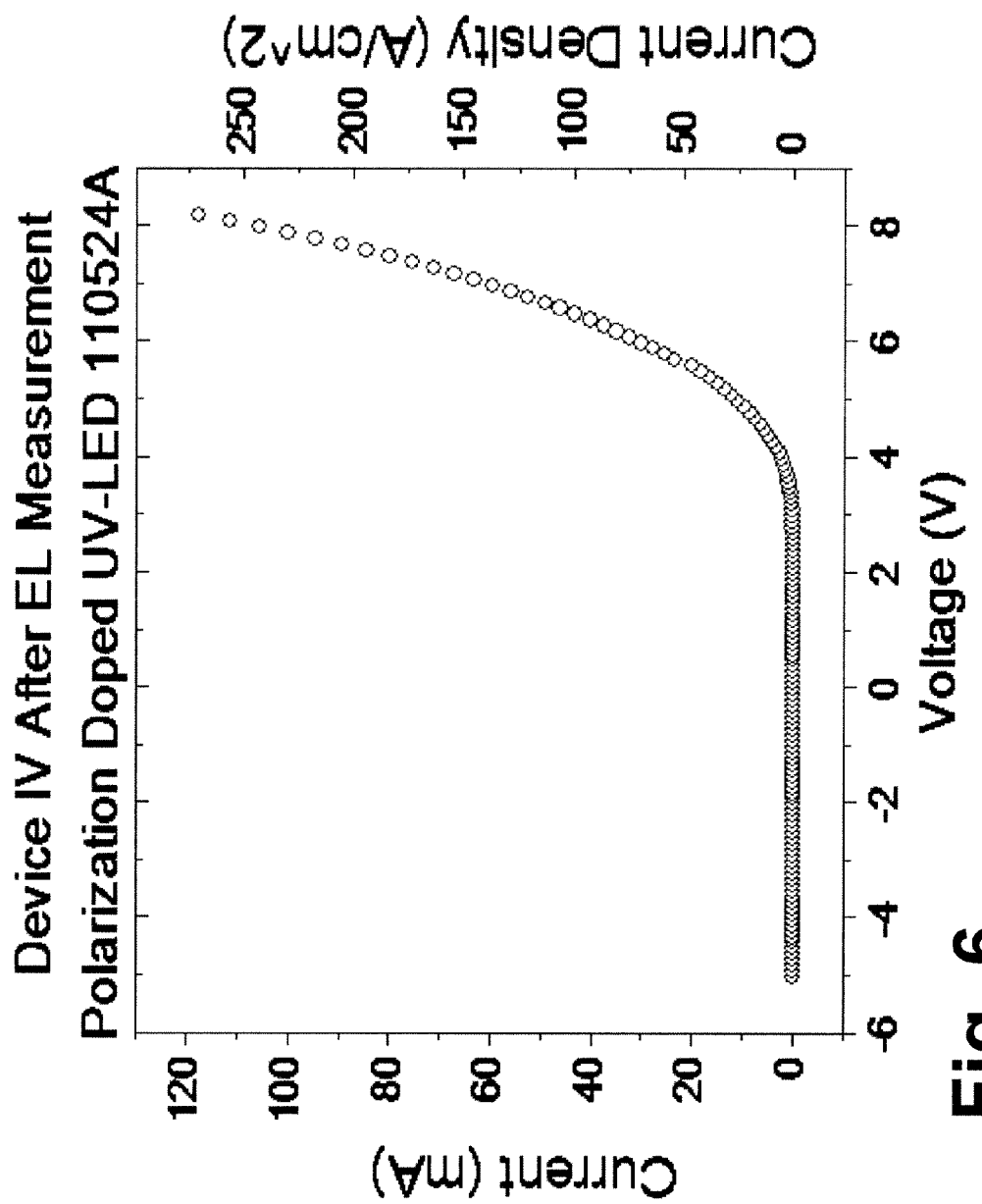
FIG. 6-8 plot measured results for a n/p nanowire diode structure fabricated in accordance with FIG. 5.
Figure 7:
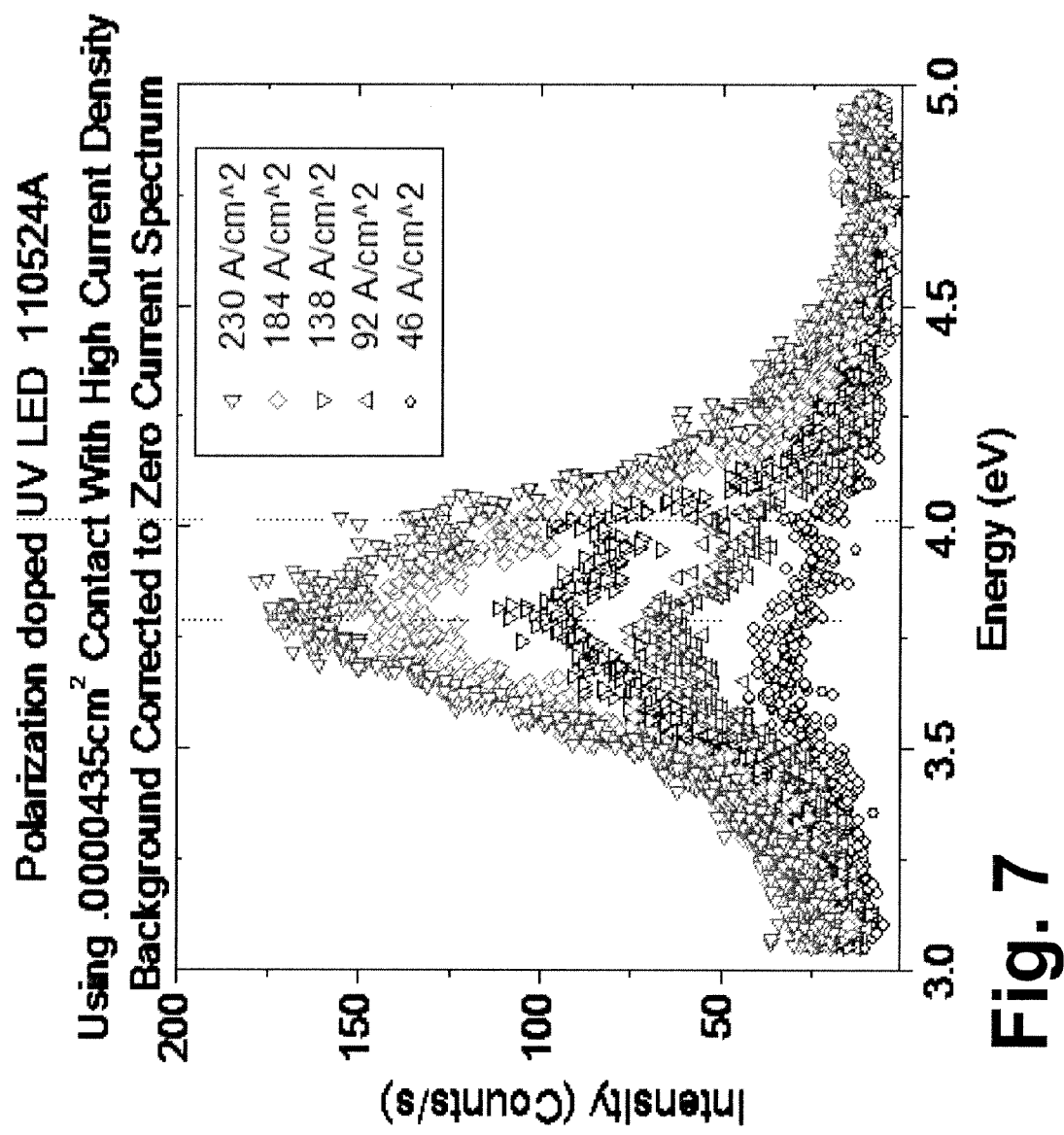
Figure 8:
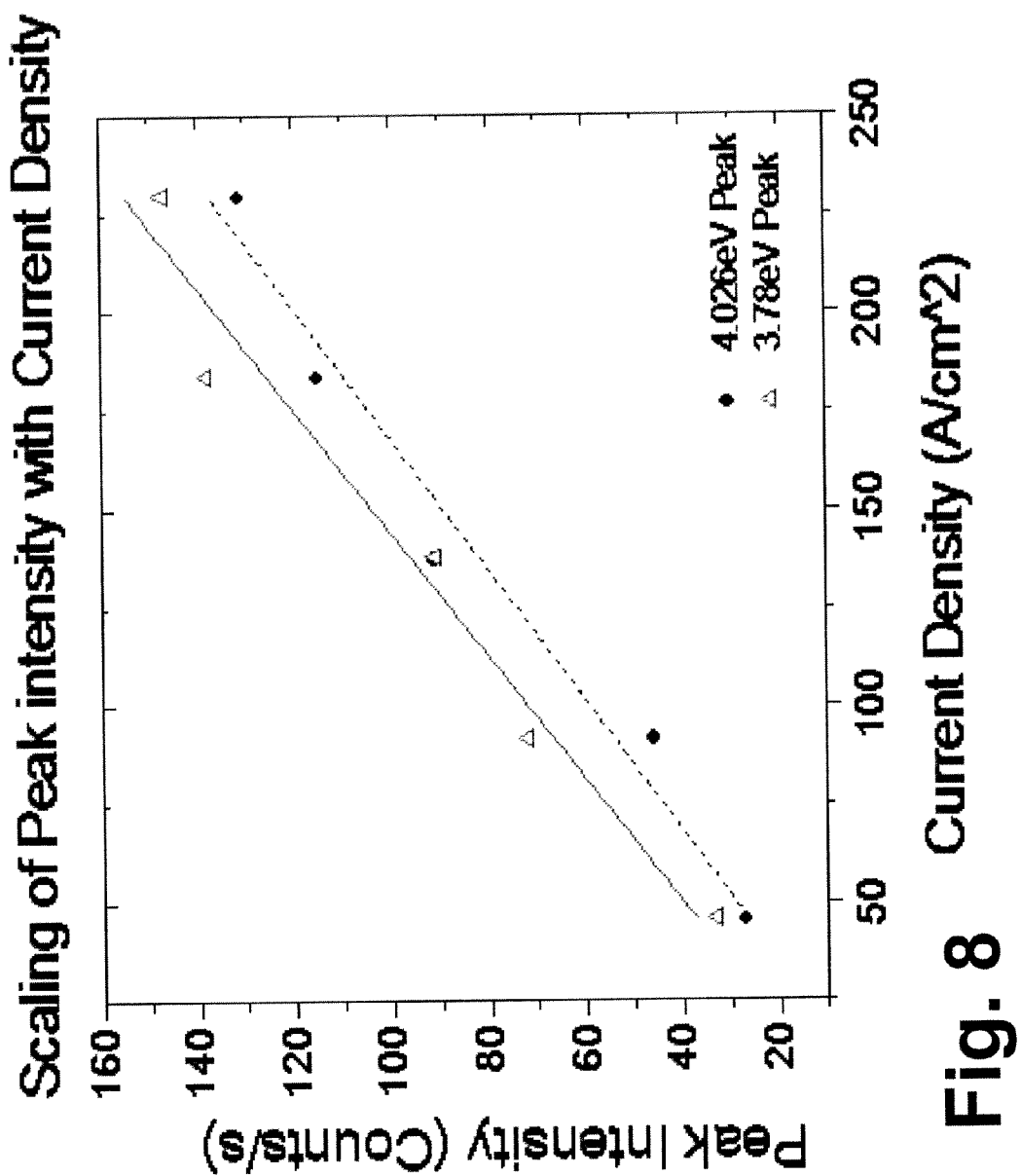

With reference to FIGS. 6-8, some illustrative characterization results are presented for an actually fabricated n/p LED device having the structure of FIG. 5 (device identification number 110524A). FIG. 6 shows a current-voltage (I-V) measurement for a polarization-doped UV LED sample. The device exhibits I-V behavior characteristic of a single rectifying junction. This suggests that the n/p junction of the graded nanowires 22 is being observed, while the n–Si/n–GaN and semiconductor/metal junction from the unannealed Ni/Au forming the contact 32 are both behaving as ohmic or quasi-ohmic contacts.

FIG. 7 shows electroluminescence (EL) results for the sample. The device shows clear, bright emission containing two principal peaks, one at 4.026 eV which is very sharp and a broader one centered around 3.78 eV. The 4.026 eV emission is near to the expected value (4.0 eV) for the $Al_{0.50}Ga_{0.50}N$ quantum well 28. The broader 3.78 eV emission peak seems to blue shift with higher applied current/voltage. It is expected that the precise value of the emission peaks can be tuned by adjusting the composition and/or width of the quantum well 28. FIG. 8 plots peak intensity versus current density for the 3.78 eV and 4.026 eV peaks. Linear peak scaling with current density is observed.

The illustrative n/p LED structure of FIG. 5 is merely an illustrative example. More generally, the disclosed approach can employ compositionally graded group III-N nanowires to produce various polarization doping profiles.

Figure 9:
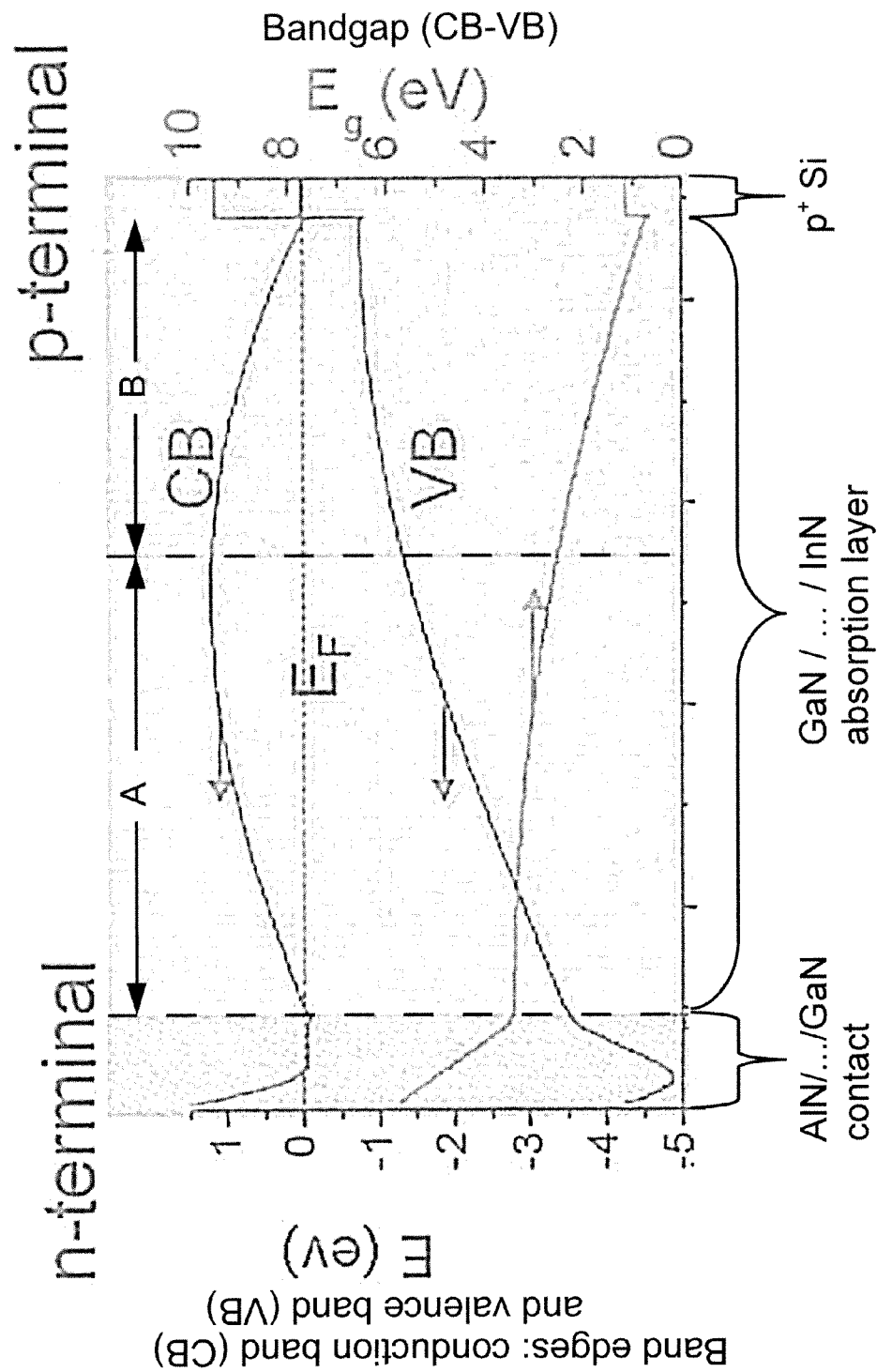
FIGS. 9-13 illustrate two contemplated polarization-doped GaN/ . . . /InGaN photodetector designs.
Figure 10:
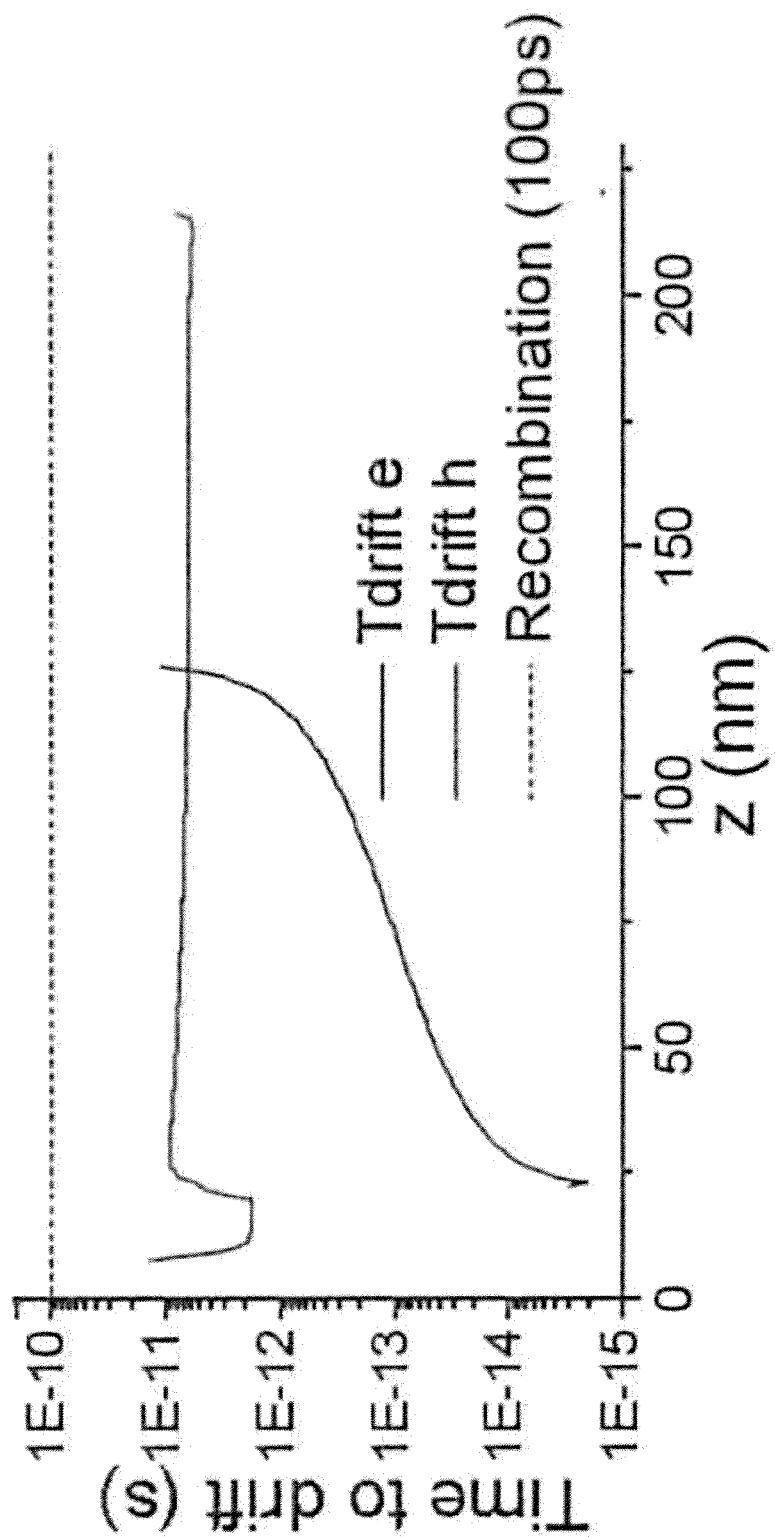

With reference to FIGS. 9 and 10, by way of another illustrative example a contemplated graded GaN/InGaN structure is shown, which is expected to be suitable for use as a photodetector device. To form nanowire heterostructure grading from InN to GaN, one contemplated approach is to nucleate InN wires first at lower temperature, and then raise the growth temperature to extend the nucleated nanowire. During the higher temperature growth, the InN can be graded to GaN using a suitable effusion cell flux grading for the In and N beams. MBE growth of bandgap graded InGaN wires was recently reported exhibiting strong PL. See Protasenko et al., "Photoluminescence of Bandgap-Graded InGaN Wires Grown by Molecular Beam Epitaxy", *Electronic Materials Conference* (Notre Dame, Ind., USA, Jun. 23-25, 2010). Unlike the AlGaN—GaN nanowire heterostructures, InGaN wires nucleate at lower temperatures (470-700° C.) at which In can be incorporated into GaN. Optical quality InN nanowires can be grown by plasma-assisted MBE on Si (111) wafers at 474-525° C. See Stoica et al., "Photoluminescence and Intrinsic Properties of MBE-Grown InN Nanowires", *Nano Letters* 6, 1541 (2006). Recently, non-tapered, symmetric InN nanowires on Si were reported by MBE utilizing an In seeding layer. Y.-L. Chang et al., "Optimization of the structural and optical quality of InN nanowires on Si(111) by molecular beam epitaxy", *J. Vac. Sci. Technol. B* 28, C3B7 (2010). By utilizing the full bandgap range from InN to GaN inclusive, as enabled by the use of nanowires, it is expected that a photodetector can be achieved with large spectral bandwidth while maintaining large internal electric fields due to the polarization charge. Such properties are not achievable in other compound semiconductors or in silicon, nor can they be achieved in planar (2D) group III-nitride heterostructures. Because of strain accommodation, the piezo-electric charge is almost negligible. The spontaneous polarization charge in InN versus GaN is sufficiently small that the Fermi level can be maintained roughly midgap through the InGaN layer. Such a photodetector is expected to enable 100 GHz response at zero bias and is expected to cover a large spectral range in the ultraviolet (UV) to visible spectrum. A suitable device structure is as follows. Starting from a p+Si substrate, a graded InGaN layer is grown from 100% In (i.e., InN) to 0% In (i.e. GaN). A suitable grading is $z^{1/2}$ (where the composition z denotes $In_zGa_{1-z}N$). This square root grading is readily achieved as it results from a linear grading of the effusion cell temperature. The resulting calculated band bending is shown in FIG. 9, where the substrate is $p^+$ Si and an n-type top contact is formed by grading GaN to AlN so as to generate an n-type polarization doping. (See line 1 of Table 1, assuming epitaxy on a Ga face). This top contact is advantageously substantially transparent due to its large bandgap, and also provides enhanced photodetector coverage into the UV as the graded GaN/ . . . /AlN has a bandgap running from 3.6 to 5 eV). Efficient electron-hole separation is achieved in the region A (bandgap of 2.7 to 3.6 eV), where polarization fields exert large electric fields on both electrons and holes. Holes are separated in the n-type UV region (that is, the GaN/AlN n-contact) as well. FIG. 10 shows calculated drift times. Reasonable estimates of electron and hole mobilities are used to calculate the drift time of electrons and holes. In all regions, the drift times are at least one order of magnitude less than the expected recombination time (100 ps). Thus, this detector should achieve a high conversion efficiency as well as a wide bandwidth and high-speed. The limiting factor is the hole drift time, which can take as long as about) 10 ps, thus at least 100 GHz performance is theoretically possible.

With reference to FIG. 9, in indicated region B between the Si substrate and the edge of region A, both electrons and holes would drift toward the p-terminal. Accordingly, no net photo-current would be produced in region B (having bandgap 0.7 to 2.7 eV). Inserting ultrathin AlN layers may alleviate this problem by shifting both bands upwards. The added complexity of the graded GaN—AlN top n-type contact may generate additional difficulty in forming top contacts or in allowing formation of a coalesced top layer. Alternatively, a Si-doped $n^+$ GaN coalesced top layer could be used.

Figure 12:
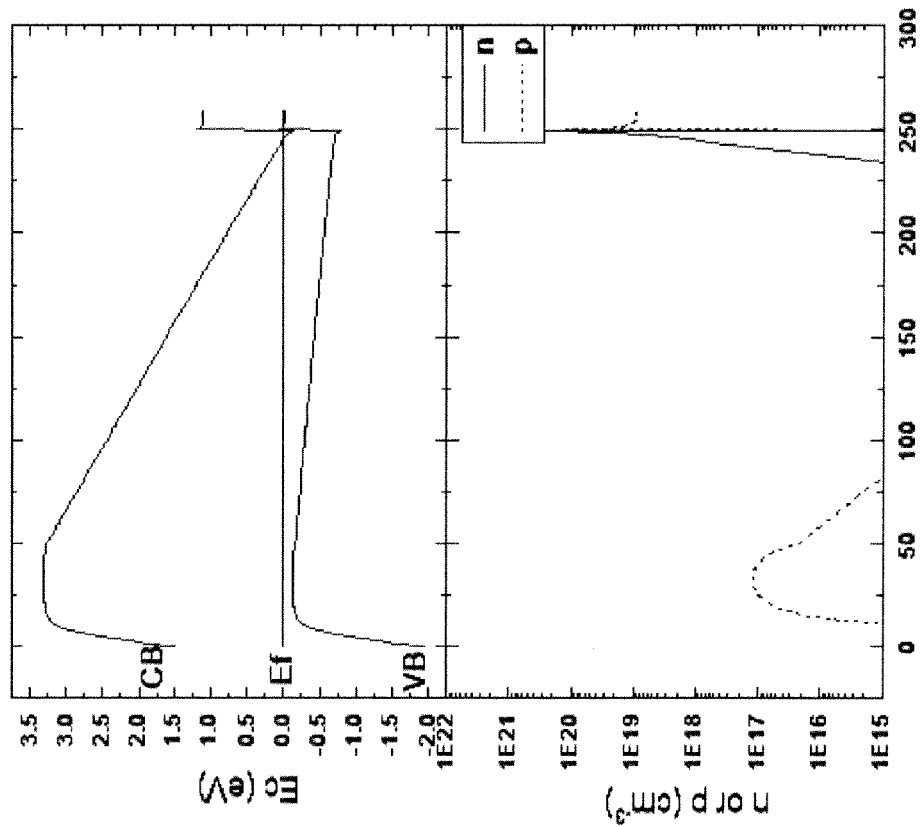
Figure 11:
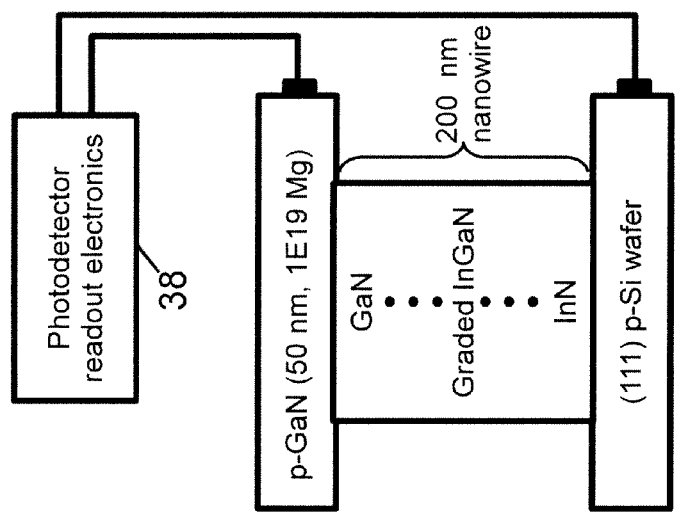
Figure 13:
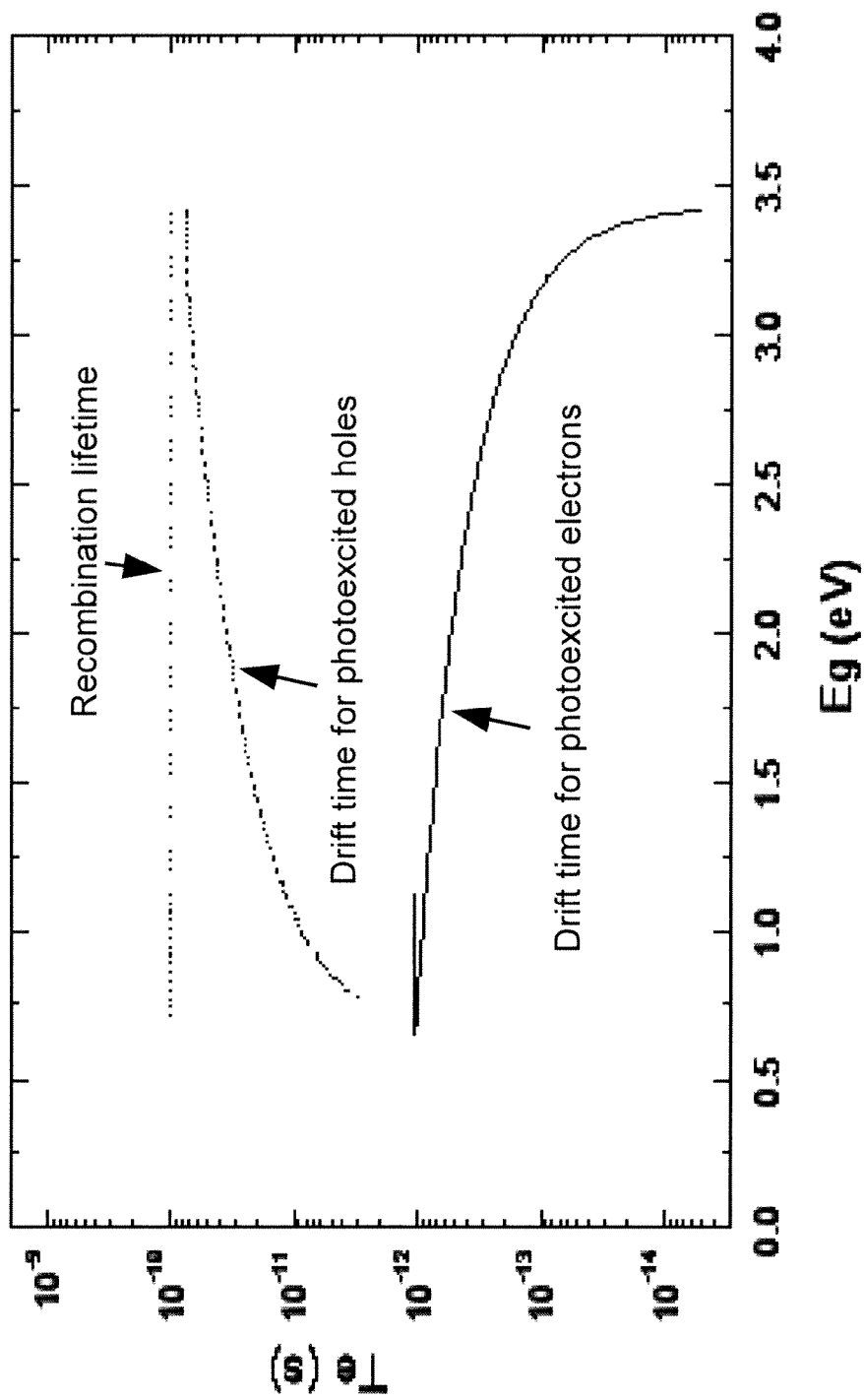

With reference to FIGS. 11-13, a second contemplated design for InGaN graded photodetector is shown. As opposed to the design of FIGS. 9 and 10, the photodetector design of FIGS. 11-13 is expected to exhibit a built-in electric field for both electrons and holes throughout the graded region to efficiently separate the photo-carriers. In the design, the nanowires are grown on p-Si and graded from InN to GaN, and at the distal GaN end are capped with a coalesced layer of p-GaN (Mg doped). FIG. 11 shows a diagrammatic layer structure for the second design. The graded InGaN layer is lightly doped with Si. The resulting band diagram is shown in the upper plot of FIG. 12. The graded InGaN region is depleted and exhibits a strong electric field for electrons and holes. Because of the built-in electric field, efficient photodetector performance is expected to be obtained for photoexcited carriers across the full bandgap range of InGaN (0.7 to 3.4 eV). Photoexcited electrons drift toward the p-Si interface. The InN/p-Si interface is expected to form a quasi-ohmic tunnel junction due to the alignment of the InN conduction band with the Si valence band. Thus electrons are converted to holes at this interface. (See lower plot of FIG. 12 showing carrier densities). Photoexcited holes drift toward the p-GaN coalesced layer. FIG. 13 plots the calculated drift time for photoexcited electrons and holes as a function of the bandgap of InGaN. The bandgap varies linearly along the nanowires of FIG. 11. The electric field for electrons is expected to be large enough that they reach the saturation velocity of $2 \times 10^7$ cm/s. Holes are not expected to reach saturation, and their ultimate velocity is calculated assuming a hole mobility of 10 $cm^2$/Vs. The drift time is calculated using the drift velocity and the distance from the photocarrier location to the contacts. It is calculated that electrons are extracted 100 times faster than the recombination lifetime. Holes are calculated to be extracted about 10 times faster than the recombination lifetime. Electron photo-current response can reach 2.4 THz while holes are limited to about 25 GHz. The photodetector should exhibit high sensitivity across 360 to 1770 nm.

With particular reference to FIG. 11, a light detection system includes the InGaN nanowires electrically connected with photodetector readout electronics 38 via a p-side electrode connected with the p-Si wafer and an n-side electrode connected with the p-GaN layer. Light impinging upon and absorbed by the InGaN nanowires generates free electrons and holes that are separated by the electric field and collected at the electrodes so as to generate a photocurrent that is measured by the photodetector readout electronics 38 and converted to a light signal level using a suitable electrical current-to-light intensity conversion formula. (Note that in this context the term "light" encompasses visible, infrared, or near ultraviolet light falling in the detection range of the InGaN nanowires, e.g. approximately the bandgap range of InGaN which is about 0.7 to 3.4 eV).

Figure 14:
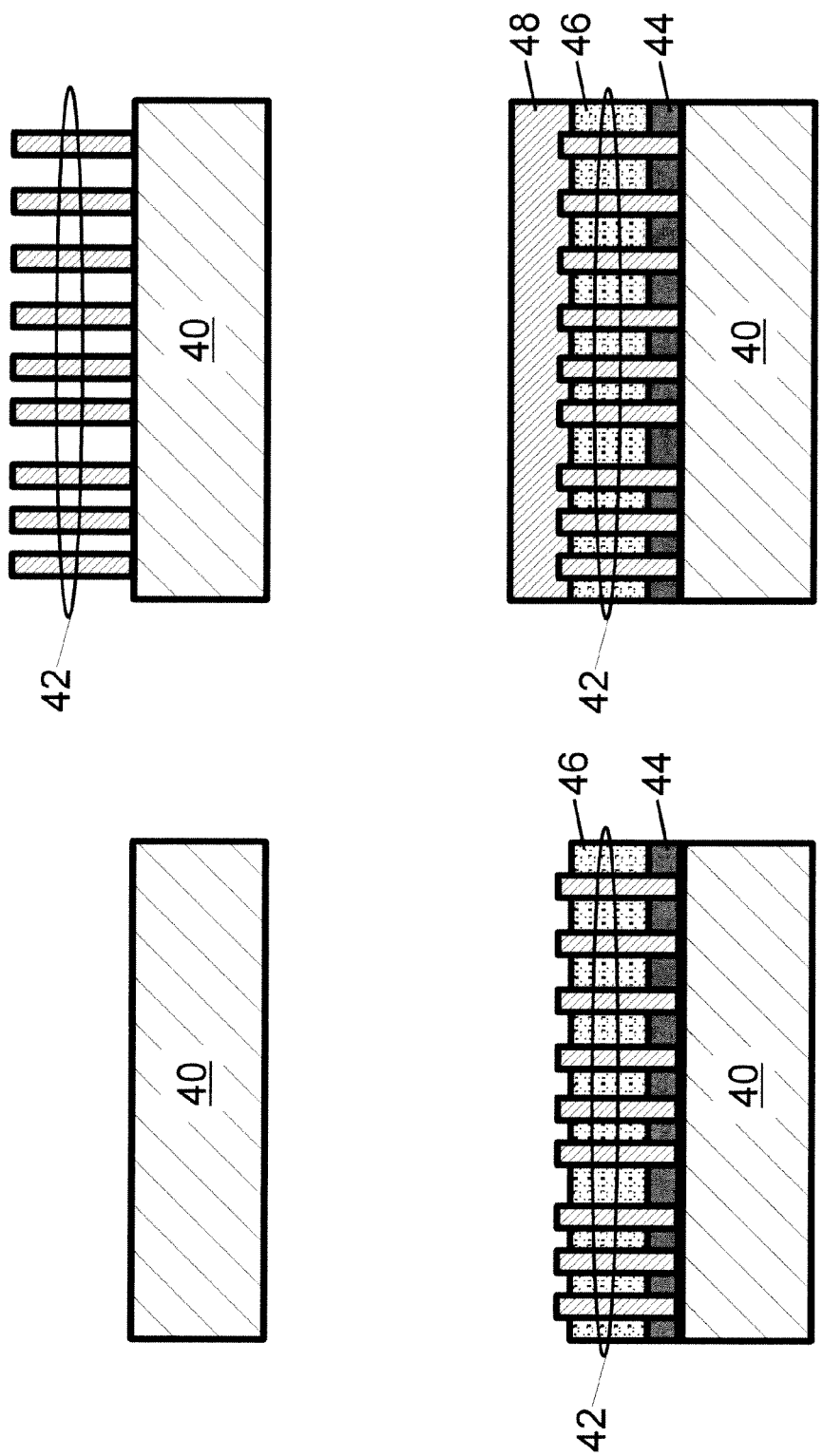
FIG. 14 diagrammatically shows fabrication of a nanowire configuration including electrical contacts suitable for use in conjunction with an electrically insulating or electrically conductive substrate.

With reference to FIG. 14, some fabrication options are described which are achievable by the use of deposition or regrowth (rather than coalescence) to form the upper electrical contact. The upper left of FIG. 14 shows an initial substrate 40 (e.g., corresponding to the substrate 10 of the embodiment of FIG. 1, or to the substrate 20 corresponding to the embodiment of FIG. 5). While the substrates 10, 20 are electrically conductive so as to form an electrical contact, the substrate 40 may in general be either electrically conductive or electrically insulating (e.g., a sapphire substrate). The upper right of FIG. 14 shows the substrate with nanowires 42 grown. The nanowires 42 may be grown by MBE as described herein, or by another technique such as metal-organic chemical vapor deposition (MOCVD), which is also known by similar labels such as organometallic vapor phase epitaxy (OMVPE) and so forth. While the illustrative nanowires 12, 22 of the embodiments of respective FIGS. 1 and 5 are group III-N nanowires, more generally any polar semiconductor that exhibits polarization charge and polarization doping effects and can be grown as self-assembled nanowires (or alternatively can be grown as nanowires by the use of a template such as a dielectric layer with drilled holes) can be employed. Some other polar semiconductors that exhibit polarization charge and polarization doping effects include ZnO, MgO, $LiNbO_3$, and so forth.

After the nanowire epitaxy, the sample shown in the upper right of FIG. 14 is removed from the growth system and processed to deposit a bottom electrical contact layer 44 and an isolating dielectric layer 46. The contact layer 44 can be substantially any electrically conductive layer or layer stack that forms an ohmic contact with the material at or near the bottoms of the nanowires 42. Typically, the contact layer 44 will be a metal or metal stack, a doped polysilicon layer, or so forth. The dielectric layer 46 provides isolation between neighboring nanowires 42, but is grown to a thickness that is slightly less than the height of the nanowires 42. The dielectric layer 46 may, for example, be a silicon oxide, or a silicon nitride, or a silicon oxynitride, or so forth.

After deposition of the layers 44, 46, an upper electrical contact 48 is deposited. The contact 48 may be a deposited layer of metal or doped polysilicon, a deposited metal stack, or so forth. Alternatively, the contact 48 may be a group III-N layer or layer structure epitaxially grown by MBE or MOCVD. The epitaxy in this approach follows the crystalline structure of the exposed upper ends of the nanowires 42. The dielectric layer 46 ensures that the contact 48 does not coat the whole length of the nanowires 42, i.e. ensures electrical isolation between the contacts 44, 48 except via the nanowires 42.

If the nanowires 42 are not grown by self-assembly but rather are defined by a dielectric template, then the template may be removed by suitable material-selective wet or dry etching prior to depositing the layers 44, 46, 48.

The fabrication options described with reference to FIG. 14 are optionally employed in fabricating the devices of FIG. 1, or of FIG. 5, or of FIG. 11.

The preferred embodiments have been described. Obviously, modifications and alterations will occur to others upon reading and understanding the preceding detailed description. It is intended that the invention be construed as including all such modifications and alterations insofar as they come within the scope of the appended claims or the equivalents thereof.

The invention claimed is:

1. A device comprising:
   a nanowire comprising a polar semiconductor material that is compositionally graded along the nanowire, the nanowire including an n-type region and a p-type region that are joined at a junction or junction region, wherein:
   the compositionally graded polar semiconductor material in the n-type region has a first compositional gradient direction along the nanowire that defines an n-type polarization doping for the n-type region, and
   the compositionally graded polar semiconductor material in the p-type region has a second compositional gradient direction along the nanowire that defines a p-type polarization doping for the p-type region,
   wherein the second compositional gradient direction along the nanowire is opposite the first compositional gradient direction along the nanowire.

2. The device as set forth in claim 1, wherein at least one of the n-type region and the p-type region comprises an impurity-free polarization doped material.

3. The device as set forth in claim 1, wherein the junction or junction region includes at least one quantum well.

4. The device as set forth in claim 1, wherein the device comprises a light emitting diode.

5. A device comprising:
   a nanowire comprising a group III-nitride polar semiconductor material whose group III composition is compositionally graded along the nanowire, the nanowire including an n-type region and a p-type region that are joined at a junction or junction region, wherein:
   the compositionally graded polar semiconductor material in the n-type region has a first compositional gradient direction along the nanowire that defines an n-type polarization doping for the n-type region, the n-type region comprising a compositionally graded alloy of gallium nitride and aluminum nitride having an Al/Ga composition that is graded in the first compositional gradient direction, and
   the compositionally graded polar semiconductor material in the p-type region has a second compositional gradient direction along the nanowire that defines a p-type polarization doping for the p-type region, the p-type region comprising a compositionally graded alloy of gallium nitride and aluminum nitride having an Al/Ga composition that is graded in the second compositional direction opposite the first compositional direction,
   wherein the second compositional gradient direction along the nanowire is opposite the first compositional gradient direction along the nanowire.

6. The device as set forth in claim 5, wherein the n-type region is compositionally graded from GaN distal from the junction or junction region to AlN proximate to the junction or junction region and the p-type region is compositionally graded from AlN proximate to the junction or junction region to GaN distal from the junction or junction region.

7. The device as set forth in claim 5, wherein the n-type region is compositionally graded from GaN distal from the junction or junction region to $Al_xGa_{1-x}N$ proximate to the junction or junction region and the p-type region is compositionally graded from $Al_xGa_{1-x}N$ proximate to the junction or junction region to GaN distal from the junction or junction region, where x is a value greater than zero and less than or equal to one.

8. The device as set forth in claim 7, wherein the nanowire comprises a plurality of parallel nanowires extending away from a substrate.

9. The device as set forth in claim 8, wherein the device further comprises:
   a GaN electrical contact disposed over ends of the plurality of parallel nanowires distal from the substrate.

10. The device as set forth in claim 8, wherein the device further comprises: a coalesced GaN electrical contact disposed over ends of the plurality of parallel nanowires distal from the substrate.

11. A device comprising:
    at least one nanowire having a first end and an opposite second end, the nanowire comprising a polar semiconductor material that is compositionally graded along the nanowire from the first end to the second end to define a polarization doping profile along the nanowire from the first end to the second end;
    a first electrode electrically coupled with the first end of the at least one nanowire; and
    a second electrode electrically coupled with the opposite second end of the at least one nanowire.

12. The device as set forth in claim 11, wherein:
    the polar semiconductor material comprises an alloy of a first polar semiconductor material (X) and second polar semiconductor material (Y), and
    the compositional grading along the nanowire from the first end to the second end defines:
    a p-type region compositionally graded toward higher Y/X ratio alloy moving away from the first end and toward the second end such that the p-type region has p-type polarization doping, and
    an n-type region compositionally graded toward lower Y/X ratio alloy moving away from the first end and toward the second end such that the n-type region has n-type polarization doping, wherein the p-type region and the n-type region are joined at a junction or junction region to define a diode.

13. The device of 12, wherein the first polar semiconductor material (X) is gallium nitride (GaN) and the second polar semiconductor material (Y) is aluminum nitride (AlN).

14. The device of 13, wherein the first end of the nanowire comprises GaN that is not alloyed with AlN.

15. The device of 14, wherein the junction or junction region comprises AlN that is not alloyed with GaN.

16. The device of 14, wherein the junction or junction region comprises a quantum well having a lower Y/X ratio than material of the adjacent p-type or n-type regions.

17. The device as set forth in claim 11, wherein:
the polar semiconductor material comprises an alloy of GaN and InN.

18. The device as set forth in claim 17, further comprising:
photodetector readout electronics operatively connected with the first and second electrodes and generating a light intensity output responsive to a photocurrent generated in the at least one nanowire.

19. The device as set forth in claim 11, wherein the at least one nanowire comprises a plurality of parallel nanowires.

20. The device as set forth in claim 11, wherein the first electrical contact comprises an electrically conductive substrate to which the first ends of the nanowires are secured, the electrically conductive substrate supporting the nanowires.

21. The device as set forth in claim 11, further comprising an electrical bias applied across the at least one nanowire via the first and second electrodes.

* * * * *